(12) United States Patent
Joo

(10) Patent No.: US 7,224,631 B2
(45) Date of Patent: May 29, 2007

(54) NON-SKIPPING AUTO-REFRESH IN A DRAM

(75) Inventor: Yangsung Joo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 10/930,322

(22) Filed: Aug. 31, 2004

(65) Prior Publication Data
US 2006/0047893 A1 Mar. 2, 2006

(51) Int. Cl.
G11C 7/00 (2006.01)
G11C 8/10 (2006.01)

(52) U.S. Cl. ............ 365/222; 711/202; 365/149; 365/230.06

(58) Field of Classification Search ............... 365/222; 711/202
See application file for complete search history.

(56) References Cited

U.S. PATENT DOCUMENTS

| 5,781,483 | A | * | 7/1998 | Shore | 365/200 |
| 5,995,434 | A | | 11/1999 | Ryu | |
| 6,044,029 | A | * | 3/2000 | Shore | 365/200 |
| 6,445,636 | B1 | | 9/2002 | Keeth et al. | |
| 6,556,497 | B2 | * | 4/2003 | Cowles et al. | 365/222 |
| 6,603,697 | B2 | | 8/2003 | Janzen | |
| 6,633,504 | B1 | | 10/2003 | Lee et al. | |
| 6,707,744 | B2 | | 3/2004 | Jo | |
| 6,711,082 | B1 | | 3/2004 | Lofler | |
| 6,751,143 | B2 | * | 6/2004 | Morgan et al. | 365/222 |
| 6,757,207 | B1 | | 6/2004 | Lazar | |

* cited by examiner

Primary Examiner—Amir Zarabian
Assistant Examiner—Michael Weinberg
(74) Attorney, Agent, or Firm—Leffert Jay & Polglaze, P.A.

(57) ABSTRACT

In a dynamic random access memory device, an auto-refresh method comprises receiving a command for the memory device to operate in a half-density mode. This causes a remapping circuit to remap a first memory address bit to an unused memory address location. Using the new addressing scheme, an auto-refresh operation is performed on the memory array operating in the half-density mode without skipping refresh commands.

21 Claims, 4 Drawing Sheets

NON-SKIPPING AUTO-REFRESH IN A DRAM

TECHNICAL FIELD OF THE INVENTION

The present invention relates generally to memory devices and in particular the present invention relates to refresh operations in a dynamic random access memory device.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), and synchronous dynamic random access memory (SDRAM).

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

The digit lines of each column are typically precharged to one-half the supply voltage $V_{CC}$ prior to being coupled to a memory cell. Coupling the memory cell to the digit line causes the voltage on the digit line to increase slightly above the $V_{CC}/2$ level or decrease slightly below the $V_{CC}/2$ level in response to the memory cell status.

The sense amplifier compares this altered voltage to the voltage $V_{CC}/2$ on the complementary digit line and drives the digit line that is coupled to the memory cell to the full high or low logic level. This restores the voltage on the memory cell to the voltage corresponding to the logic level that is stored in the memory cell. The logic level stored in the memory cell can then be read by determining the differential voltage between the digit lines.

As is well known in the art, DRAM memory cells must be periodically refreshed to avoid loss of data. The memory cells in a row can be refreshed by simply coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors such as rate of charge dissipation in the memory capacitor. It is desirable to reduce the number of refresh cycles in a memory device since such a reduction also reduces the number of interruptions required of a system controller to service the refresh.

One way to extend the data retention time while also reducing the required refresh cycles for the memory cells is for a DRAM to operate in a half-density mode. When a DRAM is operated in a half-density mode, two addresses are actually refreshed for every one address that is accessed while reducing the periodicity of the refresh commands.

However, one problem with the half-density mode of operation in a DRAM is that double charge dumping occurs to the sense amplifier during each refresh cycle due to the two memory addresses being accessed. Therefore, the current requirements for the memory device operating in the half-density mode are greater than a memory device having a density comparable to the reduced size of the half-density mode device. Additionally, such an increase in current during these refresh cycles may violate some current specifications for certain memory devices.

For the reasons stated above, and for other reasons stated below which will become apparent to those skilled in the art upon reading and understanding the present specification, there is a need in the art for a way to implement half-density mode in a memory device without an increase in power requirements.

SUMMARY

The above-mentioned problems with half-density mode refreshing and other problems are addressed by the present invention and will be understood by reading and studying the following specification.

The present invention encompasses a dynamic random access memory device that uses an auto-refresh method. The method comprises receiving a command for the memory device to operate in a half-density mode. This causes a remapping circuit to remap a first memory address bit to an unused memory address location. In one embodiment, the first memory address bit is row address 8 and the unused memory address location is row address 13. An auto-refresh operation is performed on the memory array with the new address scheme without skipping refresh commands.

Further embodiments of the invention include methods and apparatus of varying scope.

DETAILED DESCRIPTION

Figure 1:
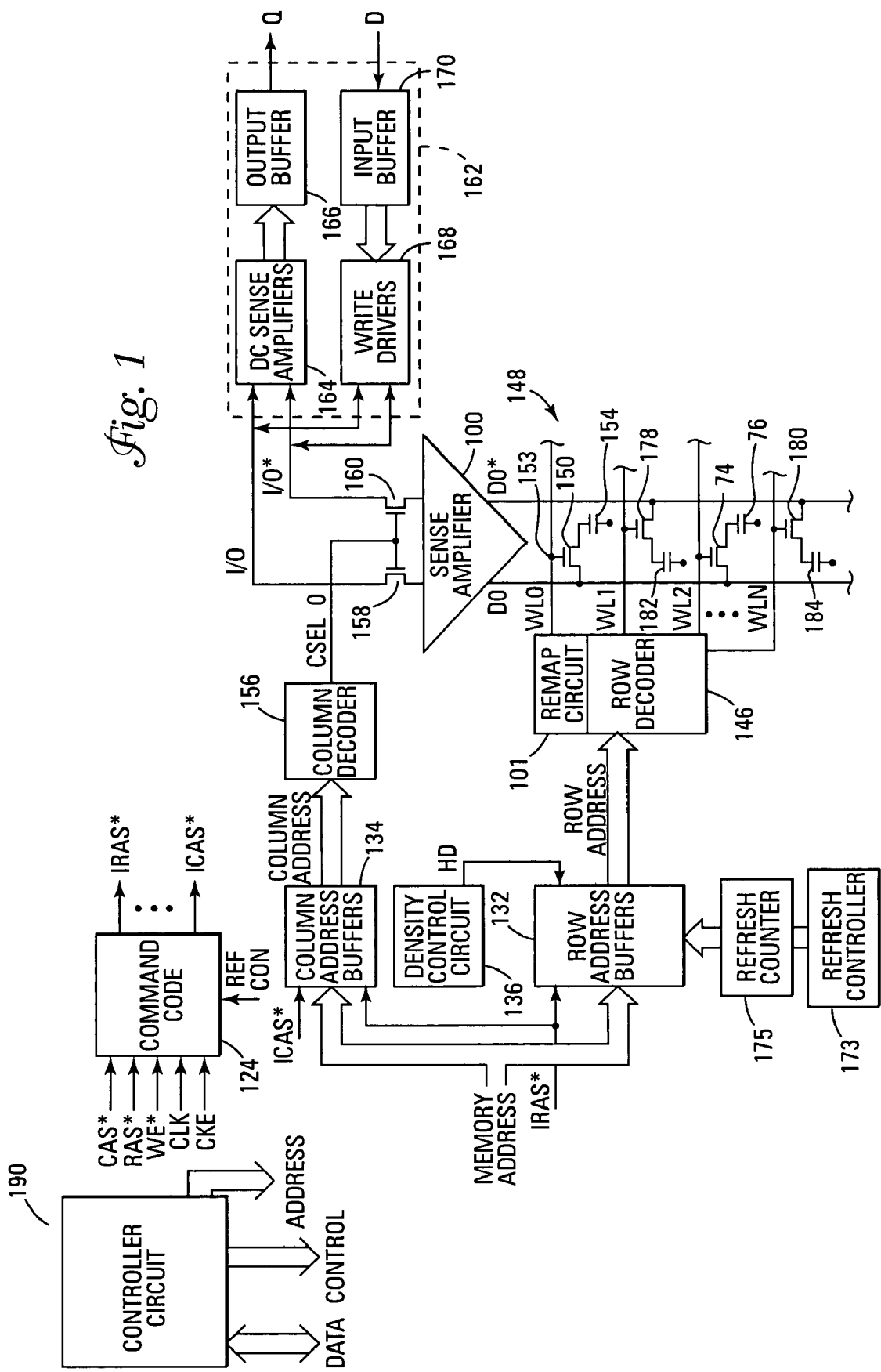
FIG. 1 shows a block diagram of one embodiment for a dynamic random access memory of the present invention in an electronic system.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment for a dynamic random access memory (DRAM) in an electronic system of the present invention. In this embodiment, the DRAM is coupled to a microprocessor or some other type of controller circuit 190. In one embodiment, this DRAM is a synchronous DRAM (SDRAM). However, the present invention is not limited to SDRAM devices but can encompass any type of memory requiring refresh operations such as asynchronous DRAMs.

Similarly, even though the embodiments of the present invention are discussed in relation to a 1 Gigabyte SDRAM, the present invention is not limited to any one memory density part. For example, a 2 GB SDRAM may be operated in the half-density mode as a 1 GB SDRAM.

The SDRAM includes row and column address buffers 132 and 134 that receive time-multiplexed row and column addresses, respectively. The SDRAM also includes a command decoder 124 that receives control signals from a controller circuit 190. The controller circuit 190 may be a processor, microprocessor, or some other type of controller circuit that generates the memory control signals.

The control signals can include a row address strobe signal (RAS*), a column address strobe signal (CAS*), a write enable signal (WE*), a clock signal (CLK), and a clock enable signal (CKE). As is well known in the art, various combinations of these control signals correspond to respective memory commands such as activate, read write, precharge, corresponding to the memory commands, including a read command and a write command. Two of the control signals generated by the command decoder 124 are an internal row address strobe signal (IRAS) and an internal column address strobe signal (ICAS*).

As is well known in the art, the address buffers 132 and 134 may comprise any circuitry for buffering and/or driving memory addresses, including, for example, pre-decoders and array buffers. Also, it will be understood that the SDRAM may receive any number of address bits in any configuration, including both multiplexed and non-multiplexed addressing schemes.

The SDRAM can operate in either a full-density mode or a half-density mode. In the full-density mode, in response to an activate or auto-refresh command (implemented by specific combinations of command signals applied to the command decoder 124 from the controller circuit 190), the row address buffers 132 operate in a well known manner to latch in a first plurality of address bits A0, A1, . . . , Az from the memory address bus. The address buffers 132 output a corresponding row address (RA) that includes row address bits RA0, RA1, . . . , RAz.

A sense amplifier 100 equilibrates voltages on a pair of complementary digit lines D0 and D0* to a predetermined voltage. In the full-density mode, a density control circuit 136 outputs an active high half-density HD signal to the row address buffers 132. In the half-density mode, the density control circuit 136 outputs an active high half-density HD signal to the row address buffers 132 to disable address (RA13) that is not used in the half-density mode. The density control circuit 136 may be, for example, a conventional mode register or a bank of programmable elements, such as anti-fuses. The control of the density control circuit 136, in one embodiment, is from the command decoder 124.

If the word line WL0 is energized, an NMOS transistor 150 is activated in a memory cell 152 in the array 148 through a control terminal 153 of the NMOS transistor 150. The array 148 is shown in FIG. 1 as having N memory cells for clarity. It is well known in the art that the array 148 may include millions of memory cells in one or more memory banks.

As a result of the NMOS transistor 150 being activated, a storage capacitor 154 storing a positive charge that represents a logical "1" bit, for example, is connected to the digit line D0 through the activated NMOS transistor 150 and an access terminal 155 (e.g., a digit line contact). Even though only one pair of complementary digit lines, D0 and D0*, and only one sense amplifier 100 are shown in FIG. 1 for clarity, it is understood that the SDRAM array 148 includes a large number of digit line pairs and sense amplifiers.

When the storage capacitor 154 is connected to the digit line D0 through the activated NMOS transistor 150 and the access terminal 155, the capacitor 154 discharges its positive charge to the digit line D0. As a result, a voltage on the digit line D0 rises by a voltage level. During the same period of time, in response to a read/write command, the column address buffers 134 operate in a well-known manner to latch in a plurality of column address bits A0–Az and output a corresponding column address to a column decoder 156. The column decoder 156 then energizes a sense amplifier for a column corresponding to the column address.

If the positive charge stored in the storage capacitor 154 is sufficient to exceed a detection threshold of the sense amplifier, the sense amplifier detects the change in voltage relative to the voltage on the complimentary digit line D0* and, in response, drives the digit line D0 to the supply voltage and the digit line D0* to approximately ground potential. The column decoder 156 then energizes a column select signal CSEL_0. The column select signal is selected in accordance with the column address in a well-known manner. This activates a pair of input/output gating NMOS transistors 158 and 160. As a result, the voltages on the digit lines D0 and D0* are transferred through an input/output bus to a data buffer 162 including well known DC sense amplifiers 164, an output buffer 166, write drivers 168, and an input buffer 170. The data buffer 162 then outputs the logical "1" bit as an output data signal Q to external circuitry (not shown). It will be understood that other types of data buffers, including those that do not contain DC sense amplifiers, output buffer, write drivers, and input buffers may be used.

If the word line WL1 is energized as described above in the full-density mode of the SDRAM, the energized word line WL1 activates an NMOS transistor 178. As a result of the NMOS transistor 178 being activated, a storage capacitor 182 storing a positive electric charge representing a "0" bit, for example, is connected to the digit line D0* through the activated NMOS transistor 178. The capacitor 182 is discharged to the digit line D0*. As a result, a voltage on the digit line D0* rises by a small voltage level. If the positive electric charge stored in the storage capacitor 182 is sufficient to exceed a detection threshold of the sense amplifier, the sense amplifier detects the change in voltage relative to the voltage on the digit line D0 and, in response, drives the digit line D0 to ground potential and the digit line D0* to approximately the supply voltage. As a result, the voltages on the digit lines D0 and D08 are transferred through an input/output bus to a data buffer 162 that outputs a logical "1" bit as an output data signal Q to external circuitry (not shown).

During operation in the half-density mode, in response to a read/write command, the row address buffers 132 operate in the same manner as described above with reference to the full-density mode. Additionally, the sense amplifier 100 also equilibrates the voltages on the digit lines D0 and D0* to the cell plate voltage as described previously.

As is well known in the art, the storage capacitors 154, 182, 176, and 184 that are used as the memory cells must be periodically refreshed to avoid a loss of data resulting from charge leaking from the capacitors. A refresh controller 173 driving a refresh counter 175 is provided for this purpose. In the refresh operation, the refresh controller 173 periodically generates a refresh trigger pulse to cause the refresh counter 175 to refresh the rows of the memory cells in the DRAM array 148. The refresh controller 173 also detects that the DRAM has entered the self refresh mode and causes a refresh trigger pulse to be generated at that time. In response to each refresh trigger pulse, the refresh counter 175 increments to generate row addresses that are applied to the row decoders 142 and 146. The row decoders 142 and 146 then activate word lines corresponding to the addresses from the refresh counter 175 to refresh the memory cells in each row of the array 148.

Figure 2:
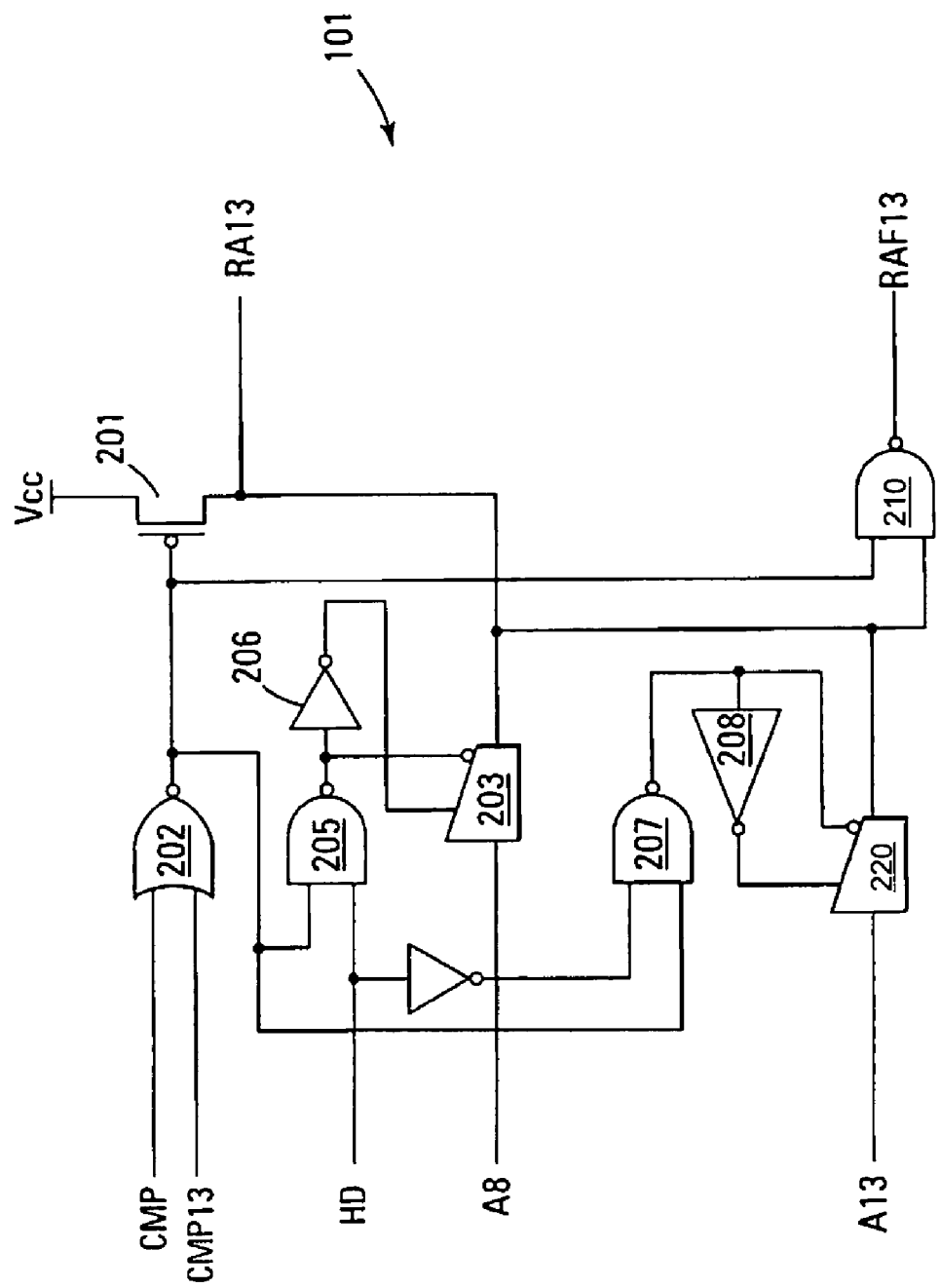
FIG. 2 shows a schematic diagram of one embodiment of a remapping circuit of the present invention to remap an address bit during a refresh operation in a half-density mode.

FIG. 2 illustrates a schematic diagram for one embodiment of the remapping circuit of the present invention. This circuit remaps an unused address bit to another address location during the refresh operation in half-density mode. In one embodiment of the present invention, since RA13 is unused during a normal half-density refresh operation, the A8 bit is remapped to the RA13 location.

During the half-density mode, the remapping circuit 101 moves A8 to the compressed-out RA13 location, the address count becomes "RA0–RA7, "Do not care bit", RA9–RA12, A8". A8, in this embodiment, performs a decoding operation to activate double wordlines in the memory array 148 of FIG. 1. Therefore, instead of the normal 4 k (i.e., $2^{12}$) address refresh cycle during a prior art half-density auto-refresh operation, the remapping circuit with the non-skipping auto-refresh method of the present invention provides an 8 k (i.e., $2^{13}$) address refresh cycle.

The embodiment of FIG. 2 of the remapping circuit of the present invention is comprised of a driving transistor 201 that is enabled by the NOR gate 202. In the illustrated embodiment, during a normal full-density operation, HD is low, CMP and CMP13 are both low and the circuit outputs A13 to RA13 and RAF13. During a full-density refresh operation, HD is low, CMP13 is high so that RA13 is compressed out. During a normal half-density operation, HD is high, CMP and CMP13 are both low and A8 is coupled through the circuit to RA13 and RAF13. During a half-density refresh operation, HD is high, CMP and CMP13 are low and A8 is coupled through the circuit to RA13 and RAF13.

The embodiment illustrated in FIG. 2 couples A8 to A13 and compresses out RA13. Alternate embodiments may compress other address bits out of the memory address depending on, for example, the size of the memory device.

In operation, transfer gates 203 and 220 are used to allow either A8 or A13 through to the RA13/RAF13 location of the input address to the memory array. The appropriate transfer gate 203 or 220 is enabled in response to a NAND gate/NOT gate 205/206 or 207/208 combination.

The A8 address bit is coupled to the input of one transfer gate 203. This transfer gate is enabled when the output of the CMP/CMP13 NOR gate 202 is high and the HD signal is high. In one embodiment, the HD is a logical high when the half-density mode is enabled. The NAND gate 205 and inverter 206 enable the transfer gate 203 for A8. The A13 transfer gate 220 is turned off by this combination of signals.

The A13 address bit is coupled to the input of the other transfer gate 205. This transfer gate 220 is enabled when the output of the CMP/CMP13 NOR gate 202 is a logical high and HD is also a logical low. These signals cause the NAND gate 207 and inverter 208 to turn on the transfer gate 220. The A8 transfer gate 203 is turned off at this time.

Figure 3:
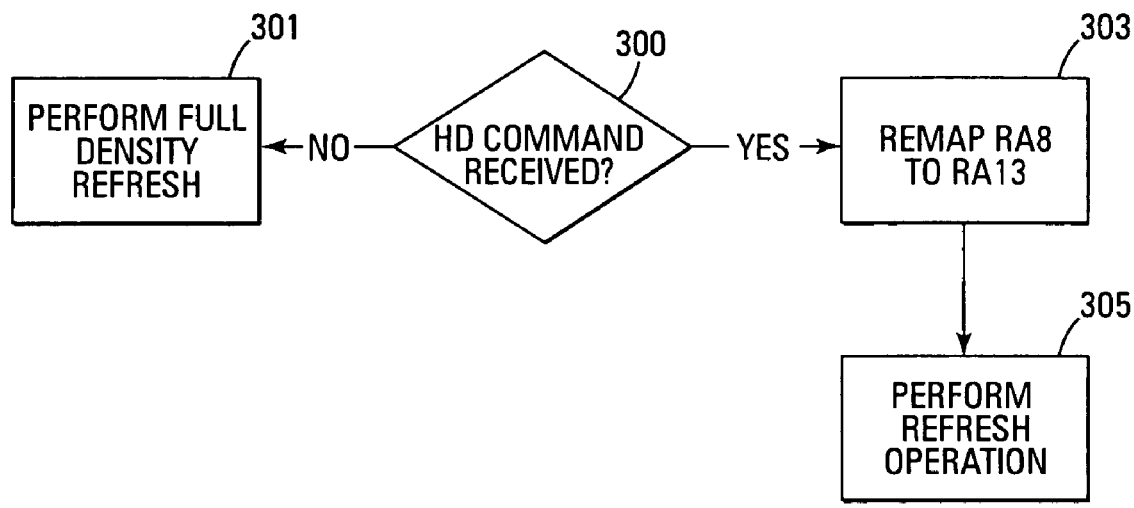
FIG. 3 shows a flowchart of one embodiment of a non-skipping auto-refresh method of the present invention.

FIG. 3 illustrates a flowchart of one embodiment of the non-skipping auto-refresh method of the present invention. The method determines if the half-density mode for the DRAM has been invoked 300. If the full-density mode is to be performed, the memory operates as normal 301. If a command for half-density operation has been received 300, A8 is remapped to the RA13 memory address location 303 and an auto-refresh operation is performed 305.

Figure 4:
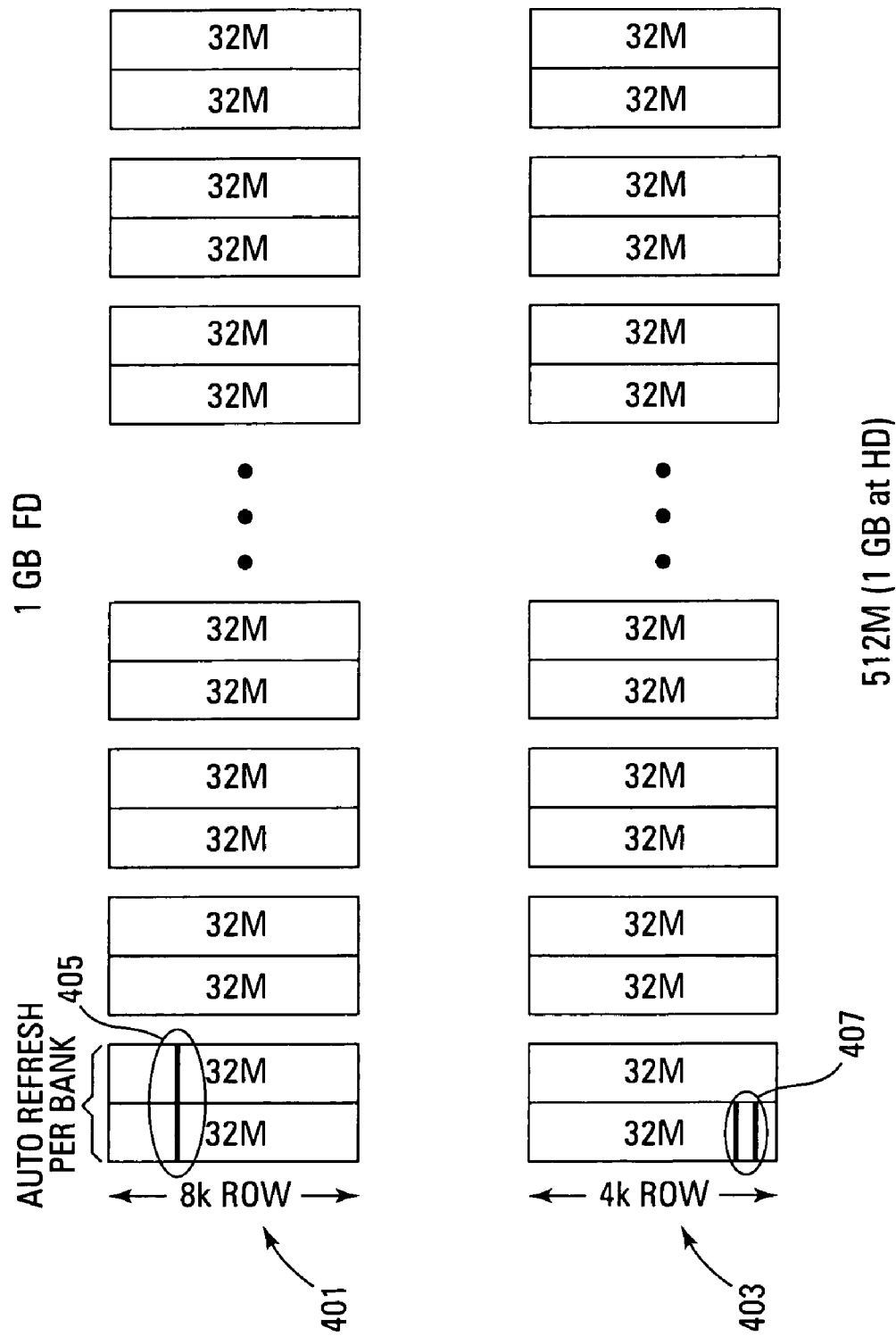
FIG. 4 shows a memory map diagram of the remapping and non-skipping auto-refresh method of the present invention.

FIG. 4 illustrates a memory map diagram of a comparison between the full-density operation of a DRAM and the half-density operation of the present invention. The embodiment of FIG. 4 is for a 1 gigabyte DRAM in the full-density mode that becomes a 512 megabyte device in the half-density mode. Alternate embodiments use other memory densities.

The upper memory diagram 401 shows an 8K row of addresses with 32 MB per memory bank. This is a 1 GB full-density embodiment of the DRAM. The lower memory diagram 403 shows a 4K row of addresses with 32 MB per memory bank. This is a 512 MB half-density embodiment of the DRAM.

The 1 GB full-density embodiment 401 shows that during an auto-refresh cycle, one row in each of two banks is refreshed 405. In the 512 MB half-density embodiment 403, two rows in each bank are refreshed 407 simultaneously. Therefore, the 8K refresh in the half-density embodiment of the present invention remains the same as the full-density embodiment and the current consumption remains the same as the full-density embodiment. Additionally, the remapping of the address bit is transparent to the memory controller so that the memory control procedures do not have to be altered.

CONCLUSION

In summary, embodiments of the auto-refresh process of the present invention provide a refresh function without skipping every other auto-refresh command as done by the prior art. The present invention activates half of the sense amplifiers, as compared to the full-density embodiment during a refresh operation, and the same number of rows.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An auto-refresh method for a dynamic random access memory having a memory array, the method comprising:
   receiving a command to operate in a half-density mode;
   remapping only one memory row address bit to an unused memory row address bit location; and
   performing an auto-refresh operation on the memory array.

2. The method of claim 1 wherein the dynamic random access memory is a synchronous memory.

3. The method of claim 1 wherein the dynamic random access memory normally
   operates in a full-density mode until receiving the command to operate in the half-density mode.

4. The method of claim 1 wherein performing the auto-refresh operation comprises
   performing the auto-refresh operation in the half-density mode without skipping auto-refresh commands.

5. The method of claim 1 wherein the memory row address bit is row address bit 8 and the unused memory address location is row address 13.

6. The method of claim 3 wherein the half-density mode uses half of the memory array.

7. An auto-refresh method for a dynamic random access memory having a memory array, the method comprising:
receiving a command to operate in a half-density mode;
remapping only one memory row address bit to an unused memory row address location; and
performing an auto-refresh operation on the memory array without skipping auto-refresh commands.

8. The method of claim 7 wherein the auto-refresh commands are issued by a refresh counter and refresh controller.

9. The method of claim 7 wherein the command to operate in the half-density mode is issued by a density controller of the dynamic random access memory.

10. An auto-refresh method for a dynamic random access memory having a memory array, the method comprising:
receiving a command to operate in a half-density mode;
remapping only row address bit 8 to row address location 13; and
performing an auto-refresh operation on the memory array without skipping auto-refresh commands.

11. The method of claim 10 and further including providing a column address to the memory array.

12. The method of claim 11 wherein the column address is applied to a sense amplifier.

13. The method of claim 10 and further including the dynamic random access memory operating in a full-density mode prior to receiving the half-density mode command.

14. A dynamic random access memory device comprising:
a memory array comprising a plurality of data storage capacitors;
a row address decoder coupled to the memory array;
a density control circuit that generates a half-density command signal; and
a remapping circuit coupled to the row address decoder, the memory array, and the density control circuit such that, in response to the half-density command signal, only one row address bit is remapped to an unused row address bit location.

15. The device of claim 14 wherein the memory array comprises a synchronous dynamic random access memory array.

16. The device of claim 14 and further including a refresh counter coupled to the row address decoder, the refresh counter generating non-skipping refresh commands in response to the half-density command signal.

17. The device of claim 14 wherein the one row address bit is row address bit 8 and the unused row address bit location is row address location 13.

18. An electronic system comprising:
a controller circuit that generates memory control signals; and
a dynamic random access memory device that operates in response to the memory control signals, the device comprising:
a memory array comprising a plurality of data storage capacitors;
a row address decoder coupled to the memory array;
a density control circuit that generates a half-density command signal; and
a remapping circuit coupled to the row address decoder, the memory array, and the density control circuit such that, in response to the half-density command signal, only one row address bit is remapped to an unused row address bit location.

19. The system of claim 18 wherein the controller circuit is a processor.

20. The system of claim 18 wherein the remapping circuit comprises a first transfer gate coupled to the one row address bit and a second transfer gate coupled to the unused row address bit location, the first transfer gate being enabled and the second transfer gate disabled in response to the half-density command signal indicating a half-density mode and the first transfer gate being disabled and the second transfer gate enabled in response to the half-density command signal indicating a full-density mode.

21. The system of claim 18 and further including:
a column address decoder; and
sense amplifiers coupled to the column address decoder and the memory array, the sense amplifiers detecting a state of a data storage capacitor in response to a row and column address.

* * * * *

UNITED STATES PATENT AND TRADEMARK OFFICE
CERTIFICATE OF CORRECTION

| | | |
|---|---|---|
| PATENT NO. | : 7,224,631 B2 | |
| APPLICATION NO. | : 10/930322 | |
| DATED | : May 29, 2007 | |
| INVENTOR(S) | : Yangsung Joo | |

It is certified that error appears in the above-identified patent and that said Letters Patent is hereby corrected as shown below:

Column 7, line 7, replace "memory row address location; and" with -- memory row address bit location; and --.

Signed and Sealed this

Twentieth Day of November, 2007

JON W. DUDAS
*Director of the United States Patent and Trademark Office*